(12) United States Patent
Chen

(10) Patent No.: US 6,466,445 B1
(45) Date of Patent: Oct. 15, 2002

(54) CLIP FOR HEAT SINK

(75) Inventor: Chun-Chi Chen, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/853,980

(22) Filed: May 11, 2001

(30) Foreign Application Priority Data

Apr. 27, 2001 (TW) ..................................... 90206777 U

(51) Int. Cl.⁷ ................................................. H05K 7/20
(52) U.S. Cl. ..................... 361/704; 24/458; 248/510; 257/727; 361/719
(58) Field of Search ................................ 361/703, 687, 361/704, 709–712, 717–719; 174/16.3; 165/80.3, 185; 257/718, 719, 722, 726, 727; 767/150, 158, 160; 24/453, 457, 458, 625; 248/316.7, 505, 510

(56) References Cited

U.S. PATENT DOCUMENTS 6,108,207 A * 8/2000 Lee ............................. 361/704
6,111,752 A * 8/2000 Huang et al. ................. 361/704
6,118,661 A * 9/2000 Lo .............................. 361/704
6,205,026 B1 * 3/2001 Wong et al. .................. 361/704
6,250,375 B1 * 6/2001 Lee et al. .................... 165/80.3
6,318,452 B1 * 11/2001 Lee ............................ 165/80.3

* cited by examiner

Primary Examiner—Gerald Tolin

(57) ABSTRACT

A clip (10) for securing a heat sink (20) to an electronic device (30) mounted on a circuit board (35) between two retention modules (40) includes a central pressing portion (12), a pair of spring portions (14), a pair of legs (16, 17) for engaging with one retention module, a connection plate (174) extending outwardly from a distal end of one leg, and a handle (18) extending inwardly from a distal end of the connection plate. A pair of ribs (142) is formed on the clip for reinforcing the clip. The handle comprises a strip (188) engaging with a joint section of the clip between one spring portion and one leg, and a flange (186) opposite to the strip and abutting one edge of the joint section. When the handle is downwardly pressed, the leg connected with the handle moves outwardly thereby disengaging the leg from the retention module.

14 Claims, 4 Drawing Sheets

CLIP FOR HEAT SINK

BACKGROUND OF THE INVENTION

1. Field of the Invention

The present invention relates to a clip for a heat sink, and particularly to a clip readily and securely attaching a heat sink to an electronic device.

2. Related Art

Computer electronic devices such as central processing units (CPUs) frequently generate large amounts of heat, which can destabilize operation and cause damage. A heat sink placed in thermal contact with an electronic device mounted on a socket transfers heat from the electronic device through conduction. Oftentimes, the heat sink is secured to the electronic device with a clip or clips.

FIG. 4 shows a conventional clip 1. The clip 1 comprises a central spring portion 2 and two downwardly extending legs 3. Each leg 3 defines a first opening 4, and a second opening 5 above the first opening 4. Each leg 3 has a tab 6 extending upwardly and outwardly from an edge thereof at the second opening 5, for receiving a tool during disassembly.

The need for a tool is unduly inconvenient and time-consuming. Furthermore, during disassembly, the tool often accidentally slips over the tab 6 and strikes a circuit board on which the electronic device is mounted.

SUMMARY OF THE INVENTION

Accordingly, an object of the present invention is to provide a clip which readily and safety disengages a heat sink from an electronic device.

To achieve the above-mentioned object, a clip in accordance with the present invention comprises a central pressing portion, a pair of spring portions extending from opposite ends of the pressing portion, a pair of legs for engaging with a retention module, a connection plate extending outwardly from a distal end of one of the legs, and a handle extending inwardly from a distal end of the connection plate. A pair of ribs is formed on the clip for reinforcing the clip. The handle comprises a strip engaging with a joint section of the clip between one spring portion and one leg, and a flange opposite to the strip and abutting one edge of the joint section. The handle is thereby positioned on the clip. When a free end of the handle is downwardly pressed, the leg connected with the handle moves outwardly thereby disengaging the leg from the retention module.

Other objects, advantages and novel features of the present invention will be drawn from the following detailed embodiment of the present invention with attached drawings, in which:

DESCRIPTION OF THE PREFERRED EMBODIMENT

Figure 1:
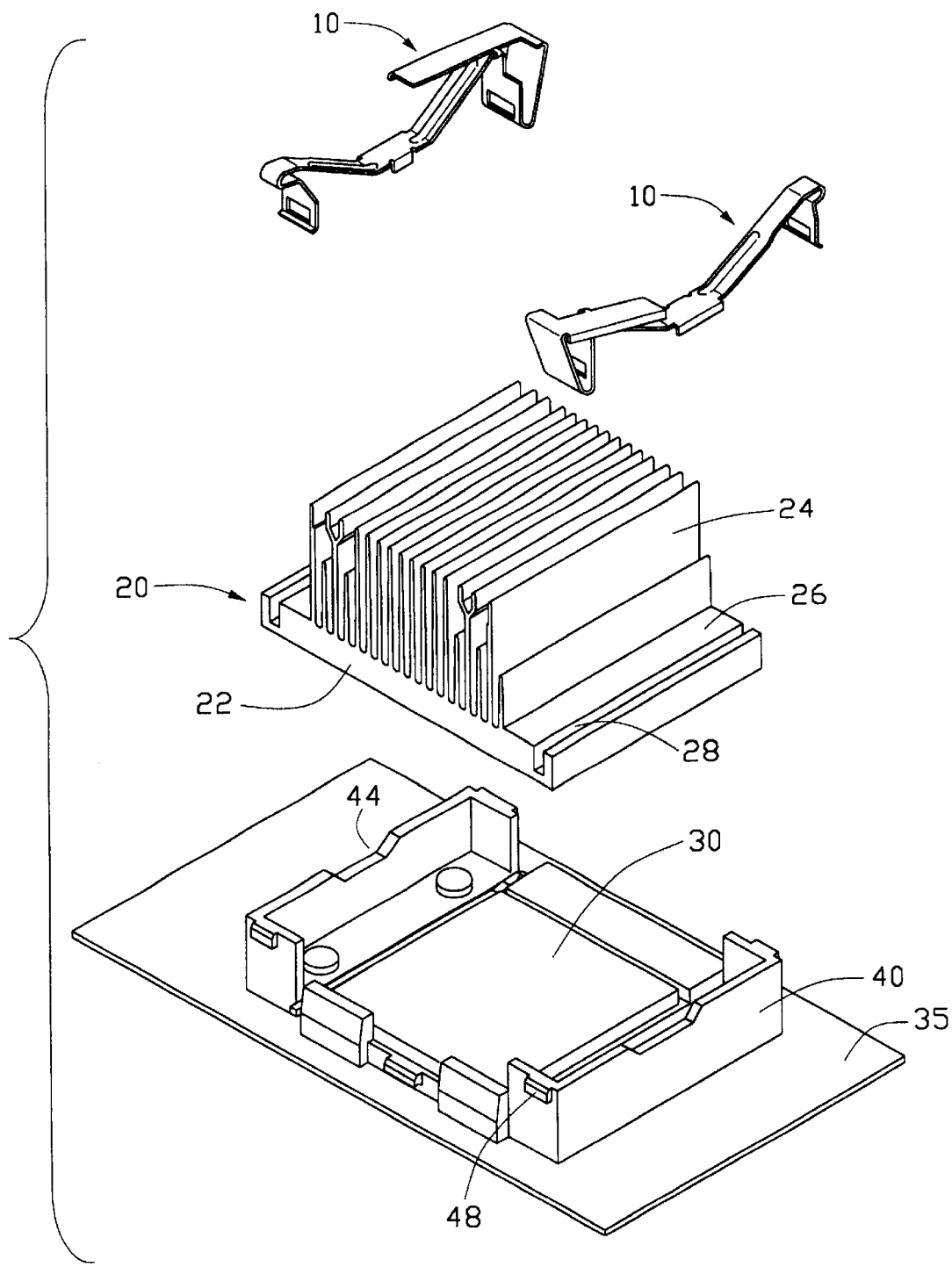
FIG. 1 is an exploded view showing two clips of the present invention attaching a heat sink to an electronic device mounted on a circuit board between a pair of retention modules.

Referring to the attached drawings, FIG. 1 is an exploded view of a heat sink 20, an electronic device 30 mounted on a circuit board 35, a pair of retention modules 40 mounted on the circuit board 35 on opposite sides of the electronic device 30, and a pair of clips 10 constructed in accordance with the present invention. The clips 10 are identical in structure.

The heat sink 20 comprises a base 22 having a bottom face (not labeled) and a top face (not labeled) opposite to the bottom face. A pair of shoulders 26 is formed on respective opposite sides of the top face of the base 22. A pair of grooves 28 is respectively defined in the shoulders 26. A plurality of fins 24 extends upwardly from the top face of the base 22 between the shoulders 26.

Each retention module 40 is secured on the circuit board 35 by conventional means. Each retention module 40 defines a cutout 44 in a top edge thereof. A pair of catches 48 is externally formed on respective opposite ends of each retention module 40.

Figure 2:
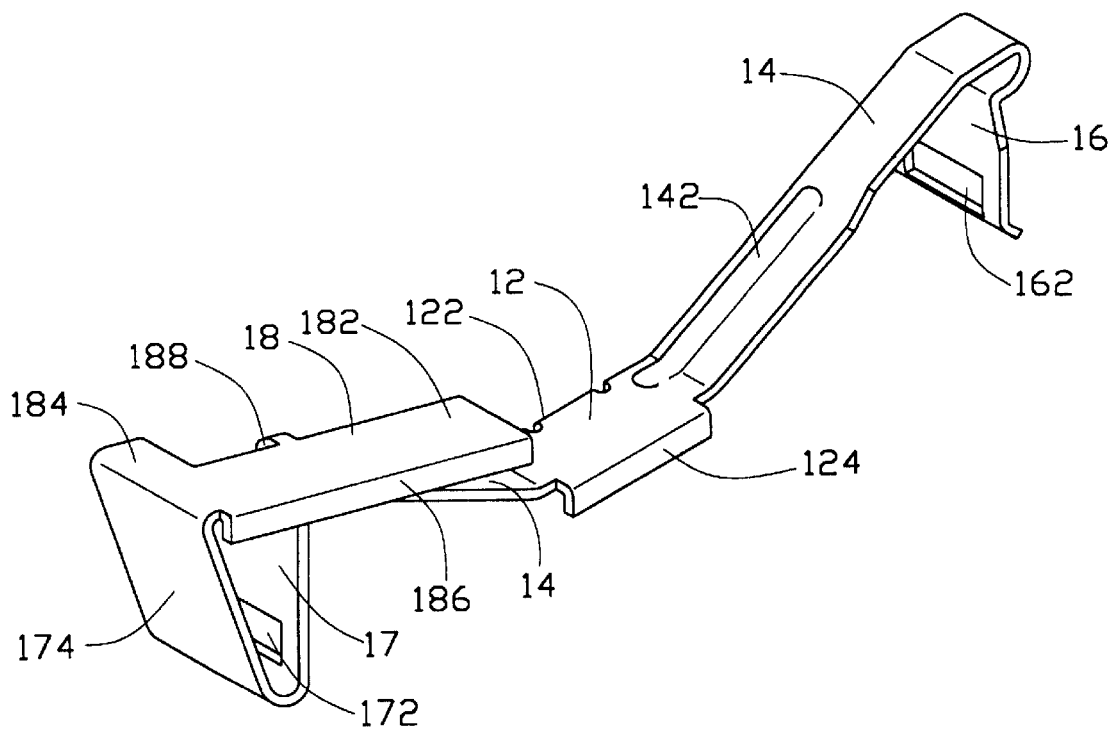
FIG. 2 is a perspective view of one clip of FIG. 1.

Referring also to FIG. 2, each clip 10 in accordance with the present invention comprises a central pressing portion 12 corresponding to one shoulder 26 of the heat sink 20, a pair of spring portions 14 extending in respective opposite directions from the pressing portion 12, and first and second legs 16, 17 respectively extending downwardly from the spring portions 14.

A pressing tab 122 depends vertically from one edge of the pressing portion 12, for being received in a corresponding groove 28 of the heat sink 20. A fixing plate 124 depends vertically from an opposite edge of the pressing portion 12, for abutting an external surface of the retention module 40 below the cutout 44. A pair of ribs 142 is respectively formed on the spring portions 14, for reinforcing the clip 10. Each rib 142 extends to the pressing portion 12. Each first and second leg 16, 17 respectively defines an opening 162, 172 corresponding to a catch 48 of the corresponding retention module 40. A connection plate 174 extends upwardly and outwardly from a free end of the second leg 17. A horizontal handle 18 extends inwardly from a distal end of the connection plate 174. The handle 18 has a free end 182, and a joint end 184 connecting the handle 18 and the connection plate 174. A bottom surface of the handle 18 abuts a joint section (not labeled) between one spring portion 14 and the second leg 17. A flange 186 depends vertically from one edge of the handle 18, and abuts one edge of the joint section. A strip 188 depends from an opposite edge of the handle 18, and is bent inwardly to engage with a bottom surface of the joint section. Thus, the handle 18 is positioned on the clip 10. More accurately, the handle 18 is positioned on the joint section between the spring portion 14 and the second leg 17.

Figure 3:
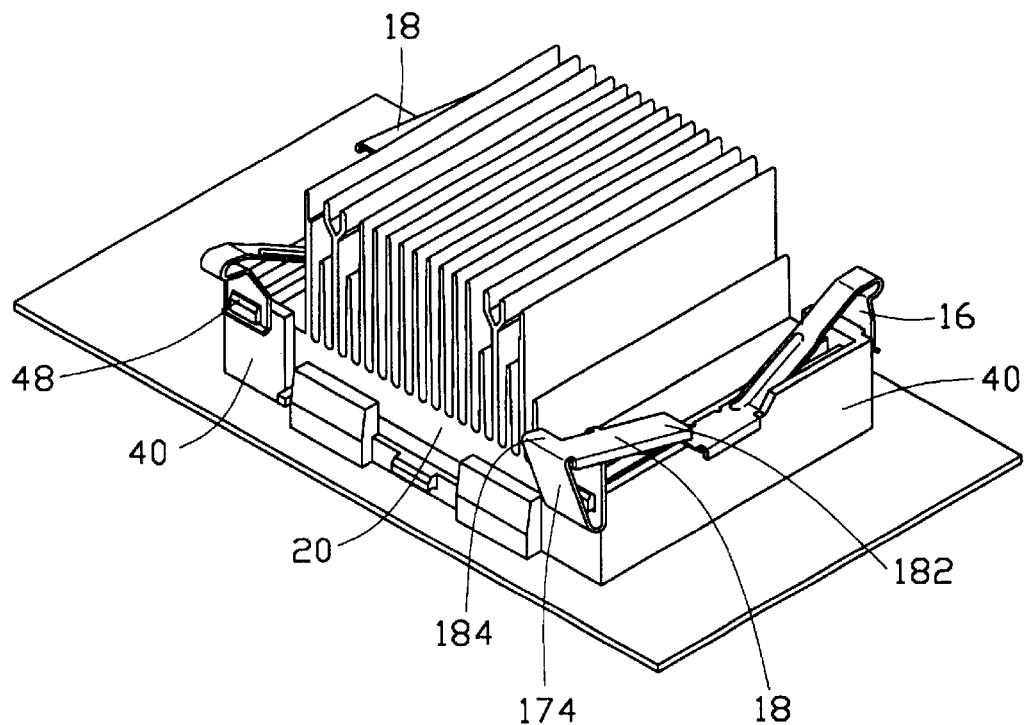
FIG. 3 is an assembled view of FIG. 1.
Figure 4:
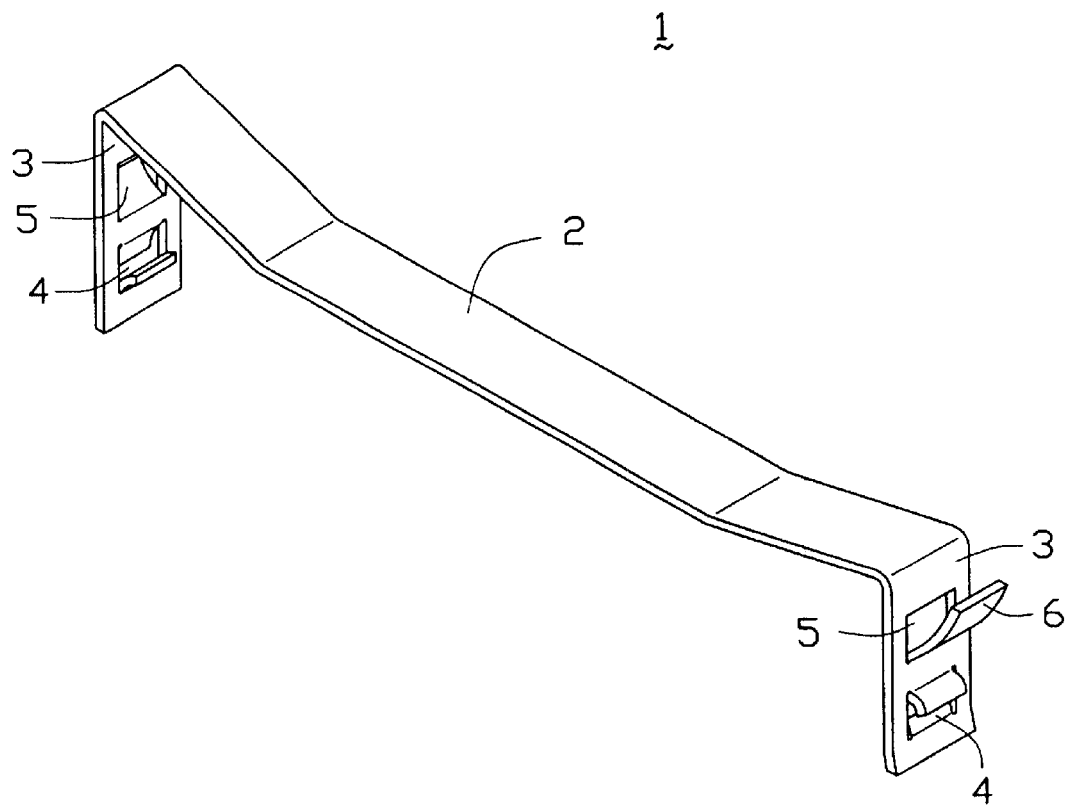
FIG. 4 is a perspective view of a conventional clip.

Referring to FIGS. 1–3, FIG. 3 is an assembled view showing two clips 10 of the present invention attaching the heat sink 20 on the electronic device 30 mounted on the circuit board 35. The pressing tab 122 and the fixing plate 124 of each clip 10 cooperate to position the clip 10 on the retention module 40. The first and second legs 16, 17 engage with the catches 48 of the corresponding retention module 40 at the openings 162, 172.

In disassembly, the free end 182 of the handle 18 is downwardly pressed. The joint end 184 of the handle 18 thus rotates upwardly about the joint section between the spring portion 14 and the second leg 17. The connection plate 174 pulls the second leg 17 outwardly. The second leg 17 thus disengages from the corresponding catch 48 of the retention module 40. The first leg 16 is then easily disengaged from the other catch 48. Thus the clip 10 is easily disengaged from the retention module 40.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted between a pair of retention modules, comprising:
   a pressing portion adapted to press the heat sink onto the electronic device;
   a pair of legs integrally extending downwardly from opposite ends of the clip and adapted to engage with one retention module;
   a connection plate integrally extending from a bottom edge of one of the legs; and
   a handle integrally extending from a top end of the connection plate, wherein when a free end of the handle is pressed downwardly, the leg from which the connection plate integrally extends is pulled outwardly.

2. The clip as claimed in claim 1, wherein the clip further comprises a pair of spring portions extending from opposite ends of the pressing portion.

3. The clip as claimed in claim 2, wherein a bottom surface of the handle abuts a joint section between the leg from which the connection plate integrally extends and one spring portion.

4. The clip as claimed in claim 2, wherein the handle comprises a strip depending from one edge thereof and engaging with a bottom surface of a joint section between the leg from which the connection plate integrally extends and one spring portion.

5. The clip as claimed in claim 4, wherein the handle further comprises a flange depending from an opposite edge thereof and abutting one edge of the joint section, the flange cooperating with the strip to position the handle on the clip.

6. The clip as claimed in claim 1, wherein a pressing tab depends from one edge of the pressing portion for being received in a groove of the heat sink.

7. The clip as claimed in claim 6, wherein a fixing plate depends from an opposite edge of the pressing portion for abutting an external surface of the heat sink, the fixing plate cooperating with the pressing tab to position the clip on the one of the retention modules.

8. The clip as claimed in claim 1, wherein a pair of ribs is formed on the clip for reinforcing the clip.

9. An electronic device assembly comprising:
   a circuit board;
   an electronic device mounted on the circuit board;
   at least one retention module mounted beside the electronic device;
   a heat sink placed on the electronic device; and
   at least one clip, each clip comprising:
      a pressing portion pressing the heat sink onto the electronic device;
      at least two legs integrally extending downwardly from opposite ends of the clip respectively and engaging with the at least one retention module; and
      a handle connected to a corresponding leg, the handle comprising a strip engaging the handle with the corresponding leg and a flange abutting one edge of the corresponding leg, the flange cooperating with the strip to position the handle on the at least one clip, wherein when a free end of the handle is pressed downwardly, the leg connected with the handle disengages from the at least one retention module.

10. The electronic device assembly as claimed in claim 9, wherein a connection plate extends outwardly from the corresponding leg connected with the at least one handle, and wherein each handle extends inwardly from a corresponding connection plate.

11. The electronic device assembly as claimed in claim 9, wherein the heat sink defines at least one groove, and at least one pressing tab of each clip depends from the pressing portion of the clip for engaging in the at least one groove.

12. A clip for attaching a heat sink to an electrical device, comprising:
   a central pressing portion;
   a pair of spring portions extending upwardly from opposite ends of the pressing portion;
   a leg extending downwardly from an end of each of the spring portions distant from the central pressing portion, each leg defining an opening therein;
   a connection plate extending upwardly from a bottom edge of the corresponding leg; and
   a handle substantially horizontally extends from a top end of the connection plate toward the central pressing portion and having a bottom face abutting against a joint section between the corresponding leg and the spring portion in connection with the corresponding leg, wherein when a free end of the handle is pressed downwardly the corresponding leg is forced to move in a direction away from the central pressing portion.

13. The clip as claimed in claim 12, wherein the handle has a strip sandwiching the joint section with the handle.

14. The clip as claimed in claim 13, wherein the handle has a flange abutting the joint section.

* * * * *